US012777968B2

(12) United States Patent
Elsherbini et al.

(10) Patent No.: US 12,777,968 B2
(45) Date of Patent: Oct. 27, 2026

(54) MODULAR PACKAGE ARCHITECTURE FOR VOLTAGE REGULATOR-COMPUTE-MEMORY CIRCUITS WITH QUASI-MONOLITHIC CHIP LAYERS

(71) Applicant: Intel Corporation, Santa Clara, CA (US)

(72) Inventors: Adel A. Elsherbini, Chandler, AZ (US); Kaladhar Radhakrishnan, Chandler, AZ (US); Anne Augustine, Chandler, AZ (US); Beomseok Choi, Chandler, AZ (US); Kimin Jun, Portland, OR (US); Omkar G. Karhade, Chandler, AZ (US); Shawna M. Liff, Scottsdale, AZ (US); Julien Sebot, Portland, OR (US); Johanna M. Swan, Scottsdale, AZ (US); Krishna Vasanth Valavala, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 17/820,982

(22) Filed: Aug. 19, 2022

(65) Prior Publication Data

US 2024/0063183 A1 Feb. 22, 2024

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 70/611* (2026.01); (Continued)

(58) Field of Classification Search
CPC . H10W 20/20; H10W 90/724; H10W 90/792; H10W 90/00; H10W 70/611;
(Continued)

(56) References Cited

U.S. PATENT DOCUMENTS 7,382,620 B2 6/2008 Khanna et al.
10,825,779 B2 11/2020 Or-Bach
(Continued)

OTHER PUBLICATIONS

U.S. Appl. No. 17/891,530, filed Aug. 19, 2022, Adel A. Elsherbini, Entire Document.
(Continued)

*Primary Examiner* — Marlon T Fletcher
*Assistant Examiner* — Samuel Jonathan Smith
(74) *Attorney, Agent, or Firm* — Akona IP PC

(57) ABSTRACT

Embodiments of a microelectronic assembly comprise: a plurality of layers of monolithic wafers and disaggregated integrated circuit (IC) dies, adjacent layers being coupled together by first interconnects having a pitch less than 10 micrometers between adjacent first interconnects, the disaggregated IC dies arranged with portions of the monolithic wafers into modular sub-assemblies; and a package substrate coupled to the modular sub-assemblies by second interconnects having a pitch greater than 10 micrometers between adjacent second interconnects. The disaggregated IC dies are surrounded laterally by a dielectric material, and the disaggregated IC dies are arranged with portions of the monolithic wafers such that a voltage regulator circuit in a first layer of the plurality of layers, a compute circuit in a second layer of the plurality of layers, and a memory circuit in a third layer of the plurality of layers are conductively coupled together in an intra-modular power delivery circuitry.

20 Claims, 8 Drawing Sheets

(51) Int. Cl.

| | |
|---|---|
| ***H10W 70/60*** | (2026.01) |
| ***H10W 70/65*** | (2026.01) |
| ***H10W 80/00*** | (2026.01) |

(52) U.S. Cl.
CPC .......... *H10W 70/65* (2026.01); *H10W 80/312* (2026.01); *H10W 80/327* (2026.01); *H10W 90/724* (2026.01); *H10W 90/792* (2026.01)

(58) Field of Classification Search
CPC . H10W 70/65; H10W 80/312; H10W 80/327; H01L 2224/80895; H01L 2224/80896; H01L 23/481; H01L 24/16; H01L 2225/1023; H01L 2225/1041; H01L 2225/1058; H01L 25/105; H01L 24/08; H01L 25/16; H01L 25/0652; H01L 25/0657; H01L 25/18; H01L 2225/06524; H01L 2225/06541
See application file for complete search history.

(56) References Cited

U.S. PATENT DOCUMENTS

| | | | | |
|---|---|---|---|---|
| 10,916,514 | B2 | 2/2021 | Kim et al. | |
| 11,387,214 | B2 | 7/2022 | Wang et al. | |
| 11,410,956 | B2 | 8/2022 | Chen et al. | |
| 2004/0018696 | A1 | 1/2004 | Wieczorek et al. | |
| 2007/0086168 | A1 | 4/2007 | Khanna et al. | |
| 2012/0211885 | A1 | 8/2012 | Choi et al. | |
| 2015/0179558 | A1 | 6/2015 | Kim | |
| 2015/0318246 | A1 | 11/2015 | Yu et al. | |
| 2016/0099214 | A1 | 4/2016 | Dalal et al. | |
| 2017/0207197 | A1 | 7/2017 | Yu et al. | |
| 2018/0108603 | A1 | 4/2018 | Machida | |
| 2018/0158749 | A1* | 6/2018 | Yu | H10W 40/22 |
| 2019/0385977 | A1 | 12/2019 | Elsherbini et al. | |
| 2020/0006324 | A1 | 1/2020 | Chen et al. | |
| 2020/0091128 | A1 | 3/2020 | Elsherbini et al. | |
| 2020/0118973 | A1 | 4/2020 | Wang et al. | |
| 2020/0212020 | A1 | 7/2020 | Zhang et al. | |
| 2020/0227401 | A1* | 7/2020 | Elsherbini | H01L 25/0652 |
| 2021/0082855 | A1 | 3/2021 | Chen et al. | |
| 2021/0159179 | A1 | 5/2021 | Elsherbini et al. | |
| 2021/0257335 | A1 | 8/2021 | Shih | |
| 2022/0051987 | A1 | 2/2022 | Elsherbini et al. | |
| 2022/0302184 | A1 | 9/2022 | Finkelstein | |
| 2022/0392855 | A1 | 12/2022 | Darmawikarta et al. | |
| 2023/0144206 | A1 | 5/2023 | Dogiamis et al. | |
| 2023/0163098 | A1 | 5/2023 | Elsherbini et al. | |
| 2023/0187386 | A1 | 6/2023 | Pietambaram et al. | |
| 2023/0197661 | A1 | 6/2023 | Darmawikarta et al. | |
| 2023/0197697 | A1 | 6/2023 | Pietambaram et al. | |
| 2023/0326889 | A1* | 10/2023 | Lin | H01L 25/18 257/221 |
| 2023/0378132 | A1 | 11/2023 | Shen et al. | |
| 2023/0420373 | A1 | 12/2023 | Duong et al. | |
| 2023/0420412 | A1 | 12/2023 | Tanaka et al. | |
| 2024/0030152 | A1 | 1/2024 | Lin et al. | |
| 2024/0063120 | A1 | 2/2024 | Elsherbini et al. | |
| 2024/0063178 | A1 | 2/2024 | Yao et al. | |
| 2024/0063179 | A1 | 2/2024 | Elsherbini et al. | |
| 2025/0006704 | A1 | 1/2025 | Zhou et al. | |
| 2025/0087632 | A1 | 3/2025 | Chou et al. | |
| 2025/0226292 | A1 | 7/2025 | Yang et al. | |

OTHER PUBLICATIONS

U.S. Appl. No. 17/891,536, filed Aug. 19, 2022, Adel A. Elsherbini, Entire Document.
U.S. Appl. No. 17/891,560, filed Aug. 19, 2022, Adel A. Elsherbini, Entire Document.
U.S. Appl. No. 17/891,654, filed Aug. 19, 2022, Adel A. Elsherbini, Entire Document.
U.S. Appl. No. 17/891,666, filed Aug. 19, 2022, Adel A. Elsherbini, Entire Document.
U.S. Appl. No. 17/891,690, filed Aug. 19, 2022, Adel A. Elsherbini, Entire Document.
U.S. Appl. No. 17/891,704, filed Aug. 19, 2022, Adel A. Elsherbini, Entire Document.
U.S. Appl. No. 17/891,727, filed Aug. 19, 2022, Adel A. Elsherbini, Entire Document.
U.S. Appl. No. 17/891,735, filed Aug. 19, 2022, Adel A. Elsherbini, Entire Document.
U.S. Appl. No. 17/891,738, filed Aug. 19, 2022, Adel A. Elsherbini, Entire Document.
U.S. Appl. No. 17/891,880, filed Aug. 19, 2022, Adel A. Elsherbini, Entire Document.

* cited by examiner

MODULAR PACKAGE ARCHITECTURE FOR VOLTAGE REGULATOR-COMPUTE-MEMORY CIRCUITS WITH QUASI-MONOLITHIC CHIP LAYERS

TECHNICAL FIELD

The present disclosure relates to techniques, methods, and apparatus directed to a modular package architecture for voltage regulator-compute-memory circuits with quasi-monolithic chip layers.

BACKGROUND

Electronic circuits, when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components, such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
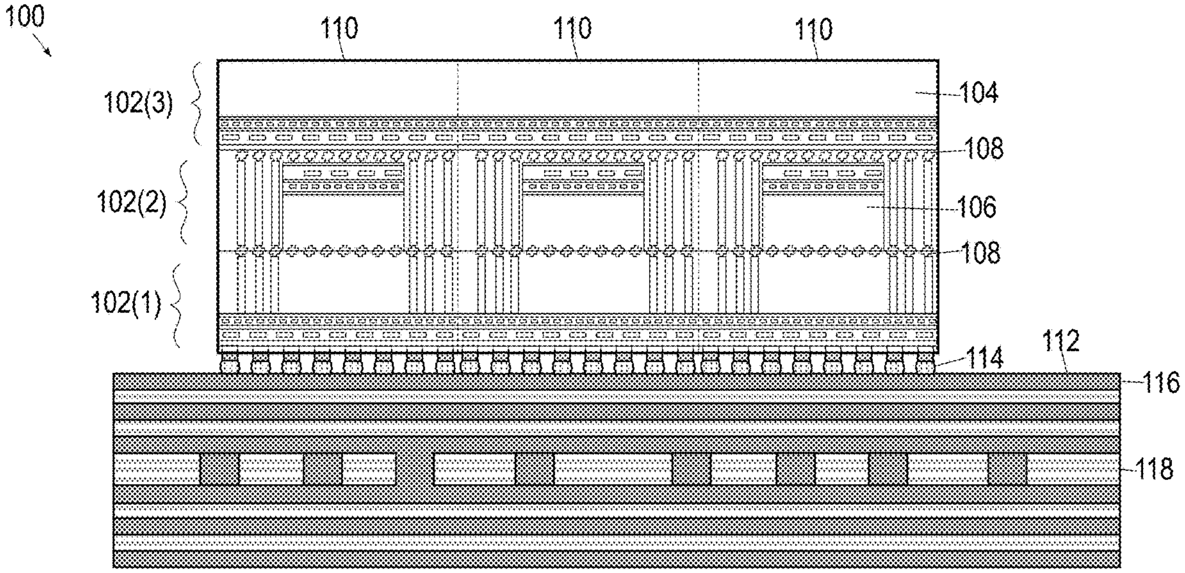
FIG. 1A is a schematic cross-sectional side view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance, such as longer delays. The manufacturing yield may also be severely impacted because the entire die may have to be discarded if even one circuit is malfunctional.

One solution to overcome such negative impacts of monolithic dies is to disaggregate the circuits into smaller dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application-specific IC, etc.), and system-on-a-chip (SoC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain universal serial bus (USB) standards, rather than for processing speed. Thus, by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In another example, a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high-pitch solder-based bumps (e.g., C2 interconnections). The bridge and the 3D stacked architecture may also be combined to allow for top-packaged chips to communicate with other chips horizontally using the bridge and vertically, using Through-Mold Vias (TMVs), which are typically larger than TSVs. However, these current interconnect technologies use solder or its equivalent for connectivity, with consequent low vertical and horizontal interconnect density.

In this regard, quasi-monolithic hierarchically integrated packaging architecture represents an opportunity to further improve the performance of these 2.5D or 3D architectures while utilizing existing infrastructure and manufacturing capabilities. The quasi-monolithic hierarchically integrated packaging architecture includes recursively coupled plurality of IC dies in microelectronic assemblies of a processing system. The plurality of IC dies may comprise active dies and/or passive dies, and at least a portion of the plurality of dies are coupled using high-density interconnects. Such package architecture can enable collating different disaggregated IC dies manufactured using varied semiconductor process nodes into a single microelectronic assembly tailored for the specific application.

Another trend to achieve scale is to use modular package compute systems, consisting of repeating units of compute and memory circuits. The total number of such units can be adjusted to support low-performance applications (e.g., clients in a server-client paradigm), high-performance applications (e.g., servers in the server-client paradigm, or graphics processors in a gaming computer, etc.) or super-performance applications (e.g., wafer-level or panel-level computers). In many of such systems, high-efficiency power delivery is a major challenge and is critical to enable desired per-watt performance.

Some attempts to address this high-efficiency power delivery challenge include using integrated regulators with the processing or memory circuits. The regulators use the same manufacturing technology as the processing or the memory circuits, which reduces efficiency since the devices will be optimized for memory/logic rather than for power delivery. Supporting high-voltage conversion on logic technologies is also challenging. Some other attempts to address this high-efficiency power delivery challenge include using separate stacked regulators at a wafer level. This enables separating the manufacturing technology between the regulator and processor/memory circuits; however, wafer-level stacking using separate stacked regulators limits manufacturing yield. Besides, current is delivered by way of TSVs, which results in added resistive (e.g., IR) drop and efficiency hits.

Accordingly, some other attempts to address this high-efficiency power delivery challenge using a quasi-monolithic hierarchically integrated packaging architecture use a modular arrangement of voltage regulator-compute-memory circuits coupled together as a stack. In such an arrangement, voltage regulator circuits are in one wafer; compute circuits (e.g., processor circuits) are in another wafer; and memory circuits are in yet another wafer. The three wafers are stacked using hybrid bonding between the wafers, forming separate layers, each layer comprising a wafer (or portion thereof). The layers may be connected face to face (active side facing active side) or face to back (active side facing substrate side) depending on various factors, such as system optimization targets and power consumption of each layer. The order may also be changed (e.g., processor circuit on top instead of memory on top). However, there are several drawbacks of this approach: the lower-tier dies have worse area utilization due to the large number of TSVs needed to deliver power to the top dies; the architecture requires a large number of TSVs to enable high-efficiency power delivery to the compute circuits without severe IR drop; the dies are assembled at the wafer-level to support the needed high-density connections, resulting in yield limitation (e.g., because all the dies have to be functional to result in a functional product). Alternatively, redundancy/repair/recovery schemes may have to be implemented, which complicates the software and design requirements.

Accordingly, embodiments of a microelectronic assembly disclosed herein comprise a plurality of layers of monolithic wafers and disaggregated IC dies, adjacent layers being coupled together by first interconnects having a pitch less than 10 micrometers between adjacent first interconnects, the disaggregated IC dies arranged with portions of the monolithic wafers into modular sub-assemblies; and a package substrate coupled to the modular sub-assemblies by second interconnects having a pitch greater than 10 micrometers between adjacent second interconnects. The disaggregated IC dies are surrounded laterally by a dielectric material, and the disaggregated IC dies are arranged with portions of the monolithic wafers such that a voltage regulator circuit in a first layer of the plurality of layers, a compute circuit in a second layer of the plurality of layers, and a memory circuit in a third layer of the plurality of layers are conductively coupled together in an intra-modular power delivery circuitry.

In various embodiments, the disaggregated IC die is part of a reconstituted wafer with known good dies (KGD), the disaggregated IC die being one such KGD The reconstituted wafers have pass-through through-dielectric vias (TDVs) for power delivery to the compute or memory circuits that do not consume silicon area. The disaggregated IC dies may be tested beforehand to make sure that the overall structure is functional. In some embodiments, the voltage regulator may also be comprised in a disaggregated IC die, further reducing cost and enabling better wafer utilization, for example, in cases where the voltage regulator circuit is made using advanced power delivery processes with III-V devices.

In many embodiments, communication between individual cells is through the monolithic wafer. In some other embodiments, communication may also be through the package or if the cell is attached to a base interposer wafer. Alternatively, the interconnection may be through a superposer wafer (e.g., on a top side of the assembly) or through jump-over chiplets that connect different circuits in one layer by way of conductive pathways in another layer (e.g., similar to bridge dies as in 2.5D packaging technologies). In some embodiments, the memory circuit may be in the disaggregated IC die. Other embodiments include various orders of circuits in the different layers, for example, with compute circuits on the top of the mote and voltage regulator circuit on the bottom; or with memory circuits on the top of the mote and voltage regulator circuits on the bottom. Having compute circuits on the top can enable better thermal management in those systems where heat transfer is a concern. In some embodiments, compute circuitry may be surrounded by memory circuits in a checker-board pattern or derivatives thereof. In various embodiments, lateral routing between cells may be done through interconnect IC dies in a layer or between layers rather than through a monolithic superposer on top of the motes. Such a configuration can facilitate power delivery, particularly in those cases in which the monolithic wafer does not have thick power planes that can support low IR drop lateral distribution. In some embodiments, power TSVs may be provisioned in the monolithic wafer to further improve the voltage distribution.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard-wired circuitry, programmable circuitry, microcontroller circuitry and/or any other type of physical hardware electrical, and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses an electric field to control current flowing through the device. A FET typically includes a channel material, a source region and a drain region provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides, including optical fiber, optical splitters, optical combiners, optical couplers, and optical vias.

The term "waveguide" refers to any structure that acts to guide the propagation of light from one location to another location, typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$), and so forth. Waveguides may be formed using various techniques, including but not limited to forming waveguides in situ. For example, in some embodiments, waveguides may be formed in situ in glass using low-temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates and printed circuit boards (PCBs), such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components, such as passive electrical components. As used herein, a package substrate may be formed of any material including, but not limited to, insulating materials such as resin-impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In the context of a stack of dies coupled to one another, or in the context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one or more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity, and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photo-imageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicates that different instances of like objects are being referred to, and are not intended to imply that the objects so described must be in a given sequence, either temporally, spatially, in ranking, or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where the element/materials with the same reference numerals may be illustrated. Further, the singular and plural forms of the labels may be used with reference numerals to denote a single one and multiple ones, respectively, of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations, which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pits or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc., present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
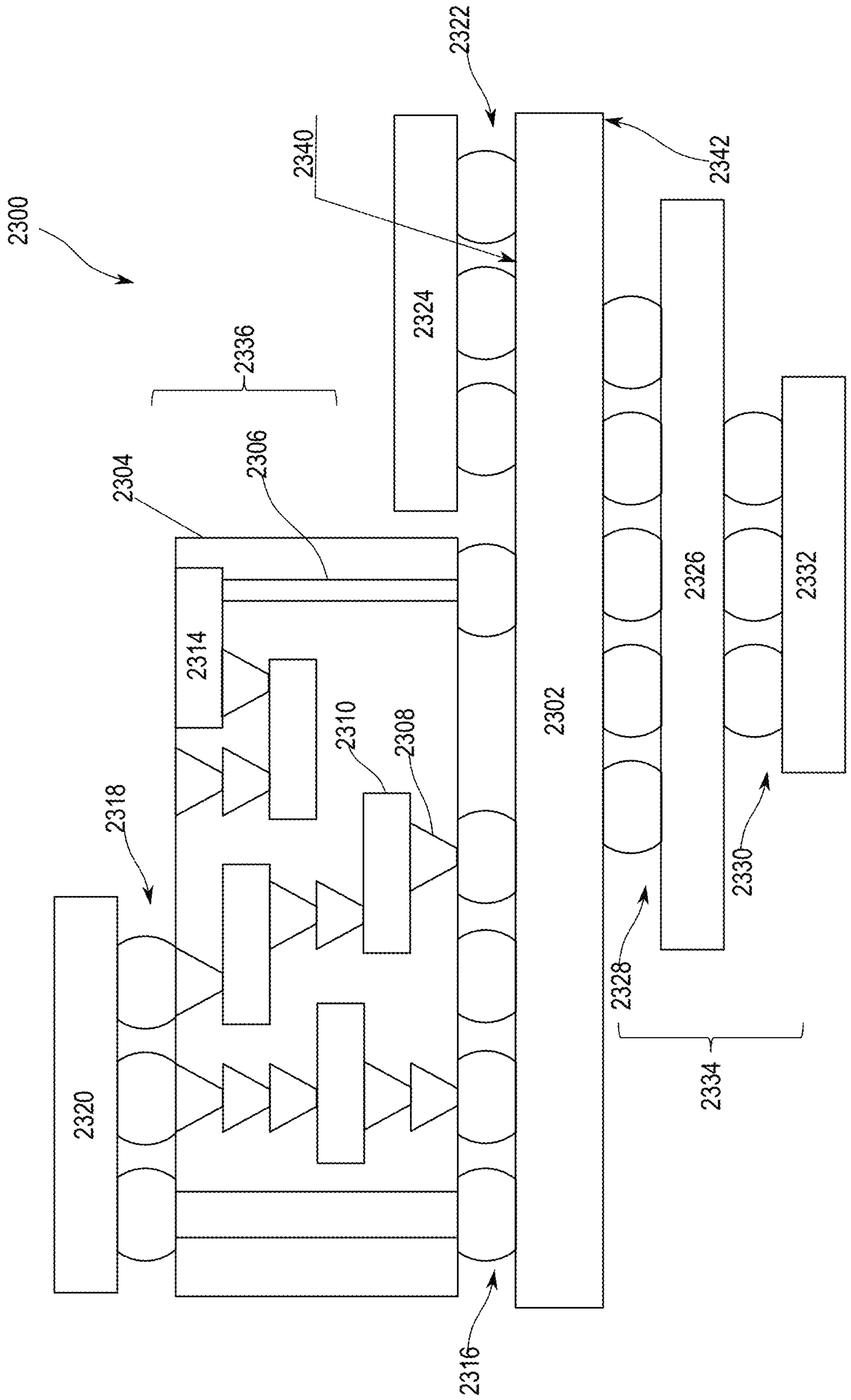
FIG. 10 is a cross-sectional side view of a device assembly that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a schematic cross-sectional view of an example microelectronic assembly 100 (plural "microelectronic assemblies 100") according to some embodiments of the present disclosure. Microelectronic assembly 100 comprises a plurality of layers 102 of monolithic wafers 104 and disaggregated IC dies 106, adjacent layers being coupled together by interconnects 108 having a pitch less than 10 micrometers between adjacent first interconnects. Interconnects 108 may comprise hybrid bonds, including metal-metal bonds and dielectric-dielectric bonds, with the pitch of less than 10 micrometers between adjacent metal-metal bonds. Note that although only three layers 102 are shown in the figure, any number of layers 102 comprising monolithic wafers 104 and disaggregated IC dies 106 may be included in microelectronic assembly 100 within the broad scope of the embodiments. In some embodiments, monolithic wafer 104 may be shaped and/or sized as a standard semiconductor wafer (e.g., circular shape having a diameter approximately between 200 millimeters and 300 millimeters) or a rectangular shaped panel (e.g., of approximately between 400 millimeters and 600 millimeters along any one side).

Disaggregated IC dies 106 are arranged with portions of monolithic wafers 104 into modular sub-assemblies 110 (also called "motes," "cells," and "unit cells" herein). Modular sub-assemblies 110 are coupled to a package substrate 112 by interconnects 114, having a pitch greater than 10 micrometers between adjacent SLIs. Package substrate 112 may comprise conductive traces 116 in an organic dielectric material 118. Examples of materials for organic dielectric material 118 are noted in the previous subsection. Note that conductive traces 116 are shown as disconnected rectangles in organic dielectric material 118; such is only for illustrative/schematic purposes, and the shapes are not intended to be accurate representations of an actual package substrate. In addition, conductive vias, bond-pads, redistribution layers, substrate cores, passive components, such as capacitors and inductors, and other elements of package substrate 112 are not shown merely for ease of illustration and not as limitations.

Figure 1B:
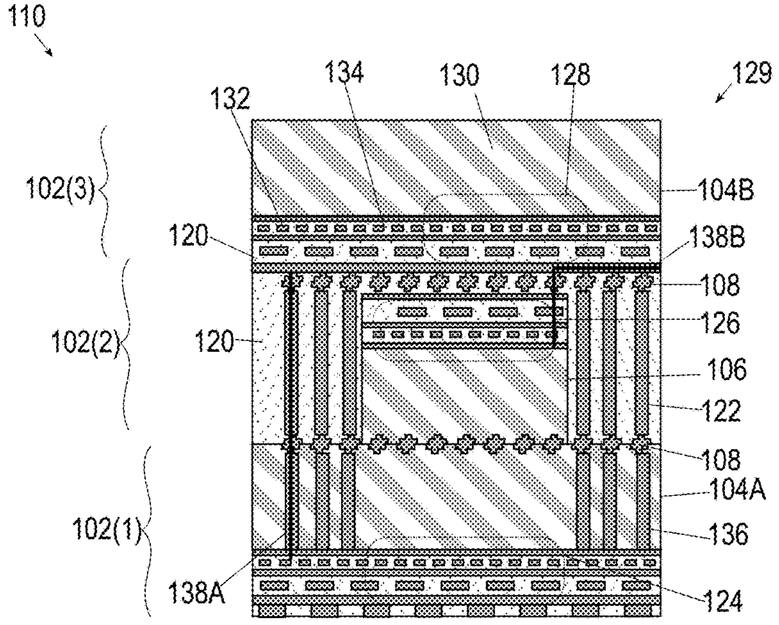
FIG. 1B is a schematic cross-sectional side view of a portion of the example microelectronic assembly of FIG. 1A.

FIG. 1B shows a schematic cross-sectional side view of an example embodiment of modular sub-assembly 110. Modular sub-assembly 110 includes several layers 102 of portions of monolithic wafers 104 and disaggregated IC dies 106, any one layer 102 having either a portion of monolithic wafer 104 or disaggregated IC die 106. For example, example modular sub-assembly 110 in the embodiment shown comprises portions of monolithic wafers 104A and 104B and disaggregated IC die 106. Disaggregated IC die 106 is laterally surrounded by a dielectric material 120. In various embodiments, dielectric material 120 comprises silicon oxide, silicon nitride, or other inorganic dielectric materials commonly used as an interlayer dielectric (ILD) in semiconductor devices. In a general sense, disaggregated IC die 106 is manufactured in wafer form with other IC dies, then diced, tested, and reassembled into a reconstituted wafer with other KGDs.

In some embodiments, TDVs 122 are provisioned in dielectric material 120 around disaggregated IC die 106, for example, to enable electrical connectivity between non-adjacent layers 102. In various embodiments, disaggregated IC dies 106 are arranged (e.g., positioned, located, chosen, etc.) with specific portions of monolithic wafers 104 into modular sub-assembly 110 such that a voltage regulator circuit 124 is in one of layers 102 (e.g., 102(1)); a compute circuit 126 is in another layer 102 (e.g., 102(2)); and a memory circuit 128 is in yet another layer 102 (e.g., 102(3)). Voltage regulator circuit 124, compute circuit 126, and memory circuit 128 may form a self-contained (e.g., independent, stand-alone) intra-modular power delivery circuitry 129 configured for appropriate power delivery among components within intra-modular power delivery circuitry 129. In other words, memory circuit 128 of any one modular sub-assembly 110 may not use power delivered by voltage regulator circuit 124 of another modular sub-assembly 110; each intra-modular power delivery circuitry 129 of any one modular sub-assembly 110 may not be conductively coupled to intra-modular power delivery circuitry 129 of another modular sub-assembly 110. Various other circuitry (e.g., communication channels between compute circuit 126 and voltage regulator circuit 124, and/or between compute circuit 126 and memory circuit 128, etc.) may also be provisioned in modular sub-assembly 110 within the broad scope of the embodiments.

In various embodiments, each of monolithic wafers 104 and disaggregated IC dies 106 may comprise a substrate 130 and a metallization stack 132 including a plurality of layers of dielectric material 120, conductive traces 134 between the layers of dielectric material 120, and conductive vias (not shown) through the layers of dielectric material 120. In some embodiments, some conductive traces 134 are smaller than other conductive traces 134. Smaller conductive traces 134 are configured for carrying signals, and larger conductive traces 134 are configured for power distribution. In some embodiments, TSVs 136 may be provisioned in substrate 130. Note that although TSVs 136 are shown only in monolithic wafer 104A in the figure, in various other embodiments, any of monolithic wafers 104 or disaggregated IC dies 106 may comprise TSVs suitably, for example, to improve the power distribution and/or address fast transients. In some such embodiments, placement and/or presence of TSVs 136 may depend on size considerations, or other constraints beyond the scope of the present disclosure.

In the example embodiment shown in the figure, disaggregated IC die 106 is coupled back-to-back with monolithic wafer 104A and front-to-front with monolithic wafer 104B. In the example shown, monolithic wafer 104A is coupled to package substrate 112; other configurations are possible, a few of which are described in reference to other figures.

Various conductive pathways 138 may be provisioned in modular sub-assembly 110. For example, conductive pathway 138A between memory circuit 128 and voltage regulator circuit 124 may be provisioned through TSVs 136 and TDVs 122. Another conductive pathway 138B between two adjacent modular sub-assemblies 110 may be provisioned through conductive traces 134 of monolithic wafer 104B in layer 102(3), which is the topmost layer in the orientation shown in the figure. Likewise, yet another conductive pathway (not expressly labeled so as not to clutter the drawing) conductively couples compute circuit 126 in disaggregated IC die 106 to voltage regulator circuit 124 in the portion of monolithic wafer 104A through TSV 136, TDVs 122 in dielectric material 120 of layer 102(2), and conductive traces 134 of the portion of monolithic wafer 104B. Various other configurations of conductive pathways 138 are possible within the broad scope of the embodiments, a few of which are described in reference to other figures.

In various embodiments, voltage regulator circuit 124 may comprise various voltage rails configured to provide current at correspondingly different voltages. For example, one or more power sources configured to deliver power at 5V may be coupled to package substrate 112. Voltage regulator circuit 124 may be conductively coupled to the one or more power sources through conductive traces 116 of package substrate 112. Voltage regulator circuit 124 may convert the 5V power to a lower voltage, for example, between 0.5V and 1.5V. In some embodiments, voltage regulator circuit 124 may convert the higher power from the one or more power sources to several different voltage rails. In an example embodiment, compute circuit 126 may be conductively coupled to one or more voltage rails configured to provide current at voltages ranging between 0.1V and 1.5V; and memory circuit 128 may be conductively coupled to one or more voltage rails configured to provide current at voltages ranging between 0.3V and 1.1V.

Figure 2:
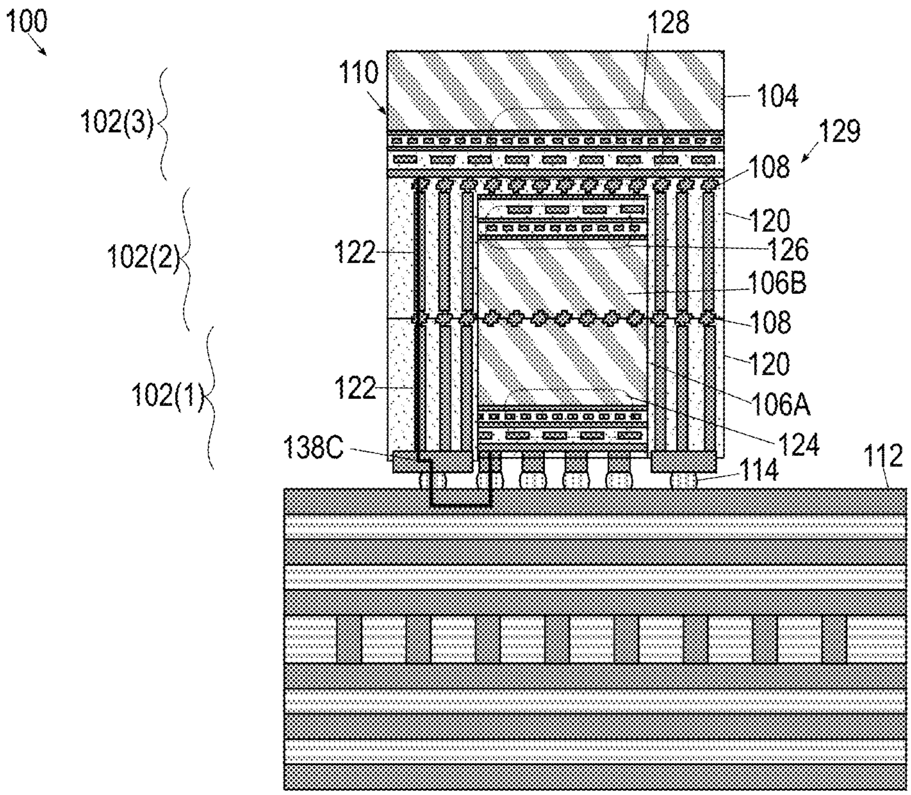
FIG. 2 is a schematic cross-sectional side view of another example microelectronic assembly according to some embodiments of the present disclosure.

FIG. 2 is a schematic cross-sectional side view of another example microelectronic assembly 100 according to some embodiments of the present disclosure. In the example shown, layer 102(1) comprises disaggregated IC die 106A laterally surrounded by dielectric material 120 and TDVs 122. Layer 102(2) comprises disaggregated IC die 106B laterally surrounded by dielectric material 120 and TDVs 122. Layer 102(3) comprises a portion of monolithic wafer 104. Example conductive pathway 138C between memory circuit 128 in monolithic wafer 104 and voltage regulator circuit 124 in disaggregated IC die 106A may be provisioned through package substrate 112, and TDVs 122 of layers 102(1) and 102(2) (and other components, such as interconnects 114, 108, etc., as appropriate). Layer 102(1) comprising disaggregated IC die 106A may be coupled to package substrate 112.

In an example embodiment, disaggregated IC die 106A may comprise voltage regulator circuit 124, disaggregated IC die 106B may comprise compute circuit 126, and the portion of monolithic wafer 104 may comprise memory circuit 128. In the example embodiment shown, disaggregated IC die 106A is coupled back-to-back with disaggregated IC die 106B. Disaggregated IC die 106B is coupled front-to-front with the portion of monolithic wafer 104. In the configuration shown, conductive pathway 138C conductively couples memory circuit 128 in the portion of monolithic wafer 104 to voltage regulator circuit 124 in disaggregated IC die 106A through package substrate 112, and TDVs 122 in dielectric material 120 of layers 102(1) and 102(2). Likewise, another conductive pathway (not expressly labeled) conductively couples compute circuit 126 in disaggregated IC die 106B to voltage regulator circuit 124 in disaggregated IC die 106A through package substrate 112, TDVs 122 in dielectric material 120 of layers 102(1) and 102(2), and conductive traces 134 of the portion of monolithic wafer 104. The disaggregated IC die 106A may be fabricated using processes particularly suitable for voltage regulator circuitry, such as a special silicon process, or processes using III-V devices such as gallium-nitride, gallium-arsenide, etc., for example, to support improved power conversion.

Figure 3:
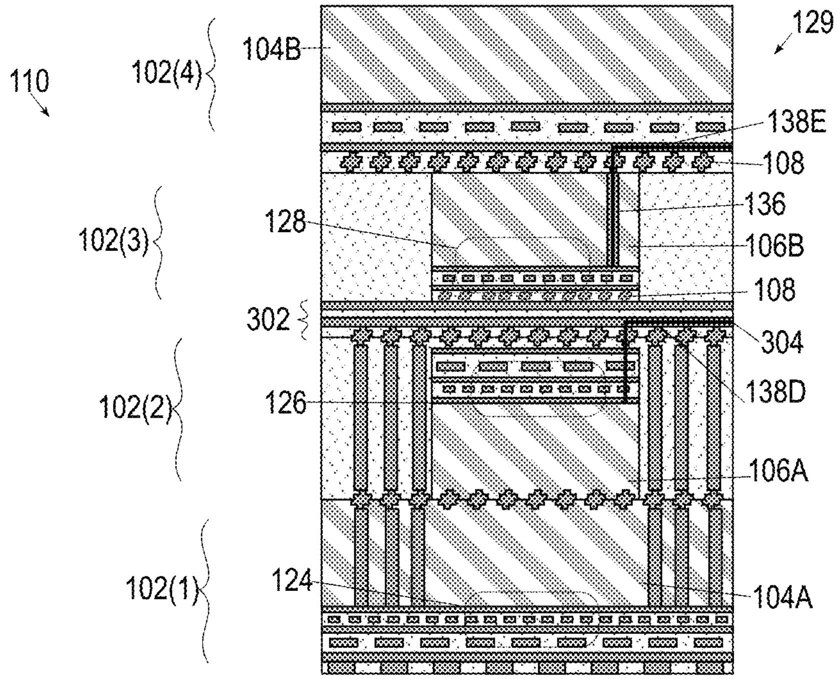
FIG. 3 is a schematic cross-sectional side view of a portion of yet another example microelectronic assembly according to some embodiments of the present disclosure.

FIG. 3 is a schematic cross-sectional side view of modular sub-assembly 110 in yet another example microelectronic assembly 100 according to some embodiments of the present disclosure. In the example shown, layer 102(1) comprises a portion of monolithic wafer 104A comprising voltage regulator circuit 124. Layer 102(2) comprises disaggregated IC die 106A laterally surrounded by dielectric material 120 and TDVs 122. Disaggregated IC die 106A may be provisioned with compute circuit 126. Layer 102(3) comprises another disaggregated IC die 106B laterally surrounded by dielectric material 120 and TDVs 122. Memory circuit 128 may be provisioned in disaggregated IC die 106B. Layer 102(4) comprises a portion of another monolithic wafer 104B. Monolithic wafer 104B may comprise conductive pathways 138 that are not part of any intra-modular power delivery circuitry 129 and instead may comprise conductive pathways coupling two or more adjacent modular sub-assemblies 110. In some embodiments, an interface layer 302 between two adjacent layers 102, for example, 102(1) and 102(2), may comprise conductive traces 304. Conductive pathway 138D through conductive traces 304 in interface layer 302 may facilitate conductively coupling two adjacent modular sub-assemblies 110. In another example, memory circuit 128 in one modular sub-assembly 110 may be conductively coupled to another memory circuit 128 in another modular sub-assembly 110 by conductive pathway 138E through one or more TSVs 136 in disaggregated IC die 106B.

Figure 4:
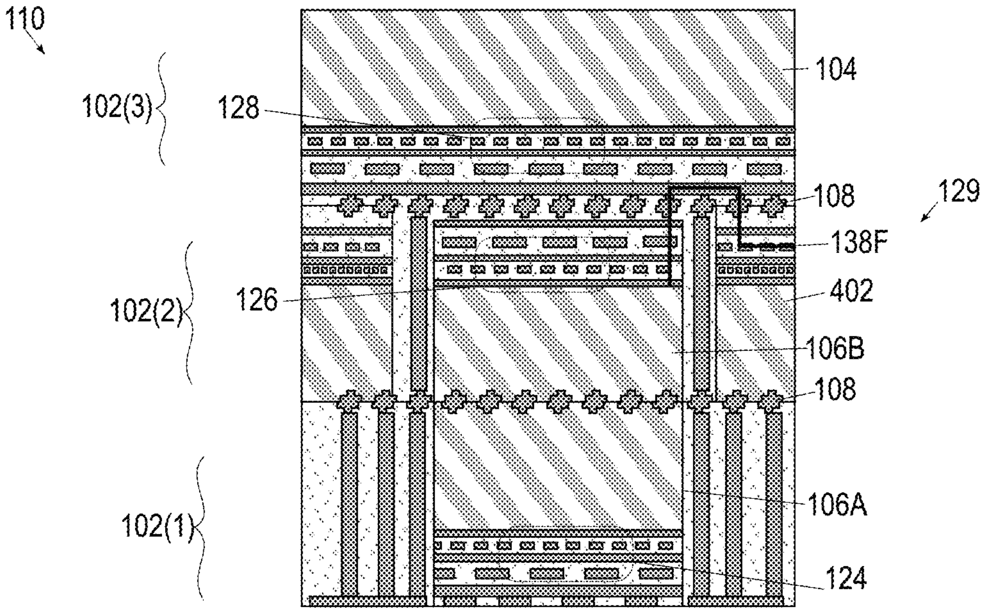
FIG. 4 is a schematic cross-sectional view of a portion of yet another example microelectronic assembly according to some embodiments of the present disclosure.

FIG. 4 is a schematic cross-sectional side view of modular sub-assembly 110 in yet another example microelectronic assembly 100 according to some embodiments of the present disclosure. The embodiment shown in the figure is similar to that of FIG. 2, except that an interconnect IC die 402 is present in layer 102(2), proximate to (e.g., adjacent to) disaggregated IC die 106B. In other embodiments, interconnect IC die 402 may be provisioned in other layers, for example, layer 102(1) comprising disaggregated IC dies 106. Microelectronic assembly 100 may comprise a plurality of interconnect IC dies 402 that do not comprise any circuits that are part of intra-modular power delivery circuitry 129. Instead, interconnect IC die 402 may comprise interconnect circuitry that is configured to conductively couple two adjacent modular sub-assemblies 110. For example, a portion of interconnect IC die 402 may be in one modular sub-assembly 110 and another portion of interconnect IC die 402 may be in an adjacent modular sub-assembly 110. Interconnect IC die 402 thus extends across a shared edge of two adjacent modular sub-assemblies 110. Example conductive pathway 138F between disaggregated IC dies 106B in adjacent modular sub-assemblies 110 may be provisioned through monolithic wafer 104 and interconnect IC die 402.

Figure 5:
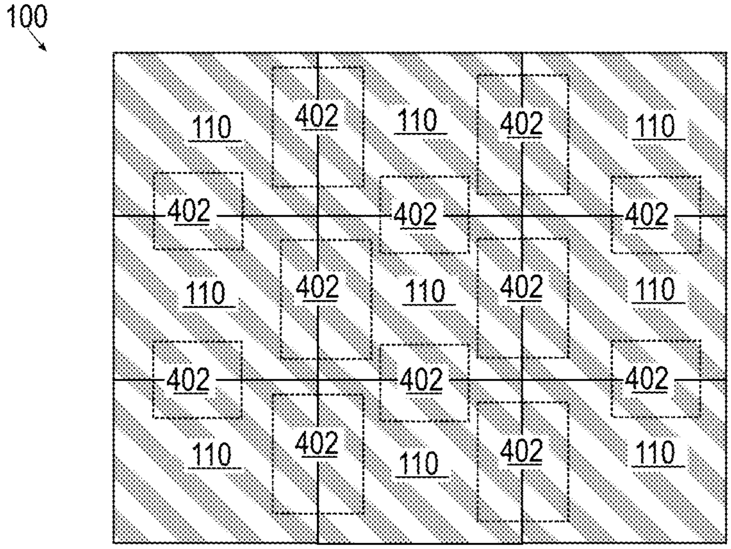
FIG. 5 is a schematic cross-sectional top view of a portion of yet another example microelectronic assembly according to some embodiments of the present disclosure.

FIG. 5 is a schematic cross-sectional top view of a portion of yet another example microelectronic assembly according to some embodiments of the present disclosure. In various embodiments, modular sub-assemblies 110 may be arranged in a regular, contiguous array. Note that although modular sub-assemblies 110 are shown as being separate, such is only a conceptual representation. In a physical embodiment, each modular sub-assembly 110 may be visually differentiated from other modular sub-assemblies 110 by conductive pathways 138 of intra-modular power delivery circuitry 129 and other structural features as described in reference to the previous figures. In the example configuration shown, any two adjacent modular sub-assemblies 110 may be conductively coupled by a single interconnect IC die 402.

Figure 6A:
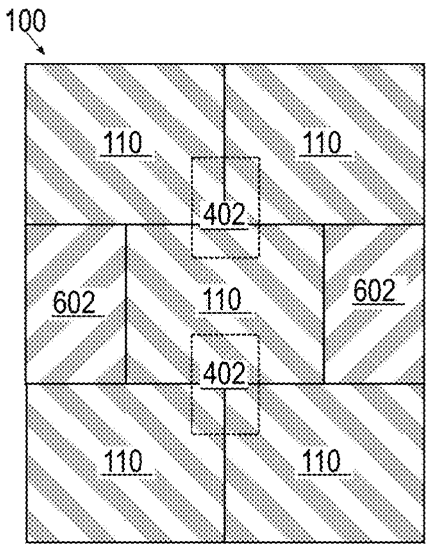
FIGS. 6A and 6B are schematic cross-sectional top views of a portion of yet other example microelectronic assemblies according to some embodiments of the present disclosure.
Figure 6B:
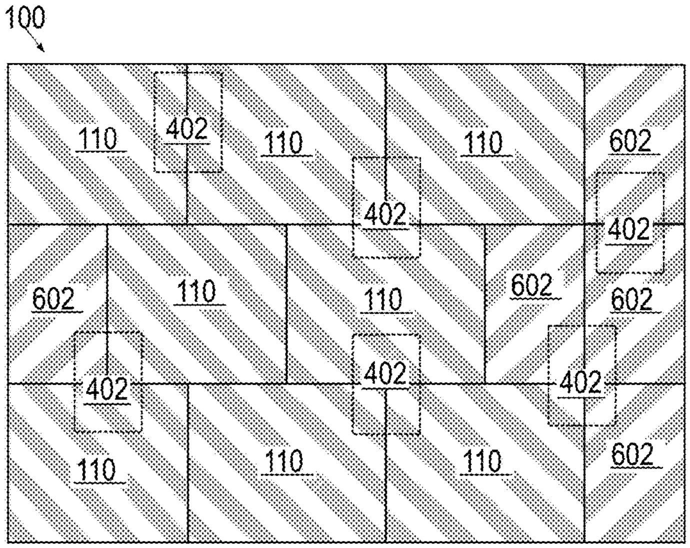

FIG. 6A is a schematic cross-sectional top view of a portion of yet another example microelectronic assembly 100 according to some embodiments of the present disclosure. In various embodiments, modular sub-assemblies 110 may be arranged in a regular, contiguous array. Note that although modular sub-assemblies 110 are shown as being separate, such is only a conceptual representation. In a physical embodiment, each modular sub-assembly 110 may be part of one or more undivided physical component (e.g., wafer) but may be visually differentiated from other modular sub-assemblies 110 by conductive pathways 138 of intra-modular power delivery circuitry 129 and other structural features as described in reference to the previous figures (e.g., in a manner somewhat analogous to intellectual property (IP) blocks in some microprocessors). In the example configuration shown, interconnect IC die 402 is located at the corner of three adjacent modular sub-assemblies 110 such that any three adjacent modular sub-assemblies 110 are conductively coupled by a single interconnect IC die 402. Other modular sub-assemblies 602 having different circuit configurations, for example, comprising interconnect circuits, high-density memory, etc. may also be included in microelectronic assembly 100 suitably. Such modular sub-assemblies 602 may operate to communicatively couple modular sub-assemblies 110 with package substrate 112, or external memory banks (not shown), or other circuits in some embodiments. In some embodiments, for example, as shown in FIG. 6B, modular sub-assemblies may be located along portions of the perimeter of microelectronic assembly 100 or dispersed elsewhere in the array of modular sub-assemblies 110. Interconnect IC dies 402 may be used to suitably conductively couple modular sub-assemblies 602 with each other and with modular sub-assemblies 110 by any structural configurations as described in reference to the previous figures. In such embodiments, interconnect IC dies 402 may also conductively couple two or more modular sub-assemblies 110.

Figure 7A:
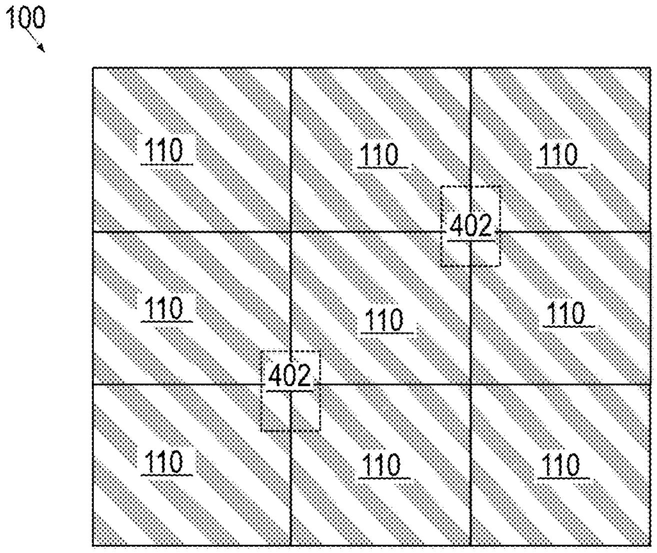
FIGS. 7A and 7B are schematic cross-sectional top views of a portion of yet other example microelectronic assemblies according to some embodiments of the present disclosure.

FIG. 7A is a schematic cross-sectional top view of a portion of yet another example microelectronic assembly 100 according to some embodiments of the present disclosure. In various embodiments, modular sub-assemblies 110 may be arranged in a regular, contiguous array. Note that although modular sub-assemblies 110 are shown as being separate, such is only a conceptual representation. In a physical embodiment, each modular sub-assembly 110 may be visually differentiated from other modular sub-assemblies 110 by conductive pathways 138 of intra-modular power delivery circuitry 129 and other structural features as described in reference to the previous figures. In the example configuration shown, interconnect IC die 402 is located at the corner of four adjacent modular sub-assemblies 110 such that any four adjacent modular sub-assemblies 110 are conductively coupled by a single interconnect IC die 402.

Figure 7B:
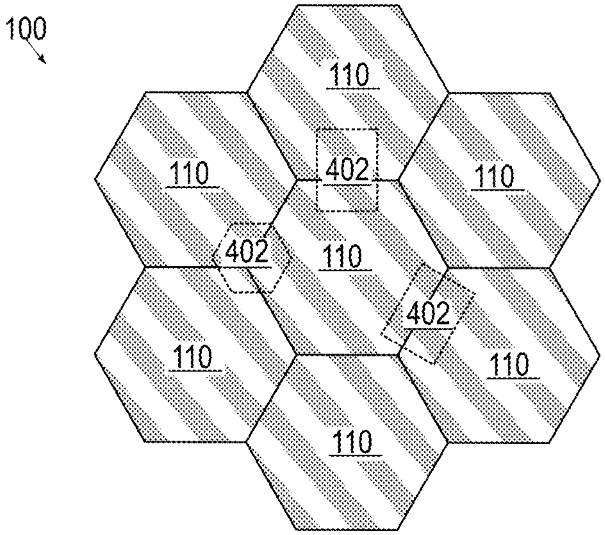

FIG. 7B is a schematic cross-sectional top view of a portion of yet another example microelectronic assembly 100 according to some embodiments of the present disclosure, modified from the embodiment of FIG. 7A in the shape of individual modular sub-assemblies 110 and/or interconnect IC dies 402. In some embodiments (e.g., as described in reference to FIG. 7A), modular sub-assemblies 110 may be rectangular and arranged in a rectangular fashion; in other embodiments, modular sub-assemblies 110 and/or interconnect IC dies 402 may have other shapes, for example, hexagonal, triangular, plus-shaped, etc., and may be suitably arranged in arrays accordingly, for example, to optimize connectivity therebetween. For example, in the embodiment of FIG. 7B, modular sub-assemblies 110 and/or interconnect IC dies 402 are hexagonal. In other embodiments, some modular sub-assemblies 110 and/or interconnect IC dies 402 may be of one shape, and other modular sub-assemblies 110 and/or interconnect IC dies 402 may be of a different shape. For example, in the embodiment shown in FIG. 7B, some interconnect IC dies 402 are rectangular and another interconnect IC die 402 is hexagonal.

In various embodiments, any conductive pathway described or provisioned in microelectronic assembly 100 may comprise, in addition to conductive traces and conductive vias, active elements such as timers, repeaters, etc., that are not shown in the figures merely for ease of illustration and so as not to clutter the drawings. In addition, lateral connectivity between adjacent modular sub-assemblies may be through one or more of interface layers 302, interconnect IC dies 402, and conductive pathways through monolithic wafers that may comprise circuits that are not part of intra-modular power delivery circuitry 129 as described in reference to the various figures. For example, although FIGS. 5-7 show adjacent modular sub-assemblies 110 being conductively coupled by interconnect IC dies 402, any one or more such interconnect IC dies 402 may be replaced by interface layer 302, monolithic wafer 104B as in the embodiment of FIG. 3, etc.

In various embodiments, any of the features discussed with reference to any of FIGS. 1-10 herein may be combined with any other features to form a package with one or more IC dies as described herein, for example, to form a modified IC die 106 or a modified microelectronic assembly 100. Some such combinations are described above, but, in various embodiments, further combinations and modifications are possible. Further, the various embodiments described in any of FIGS. 1-10 herein may be combined suitably based on particular needs within the broad scope of the embodiments.

Example Methods

Figure 8:
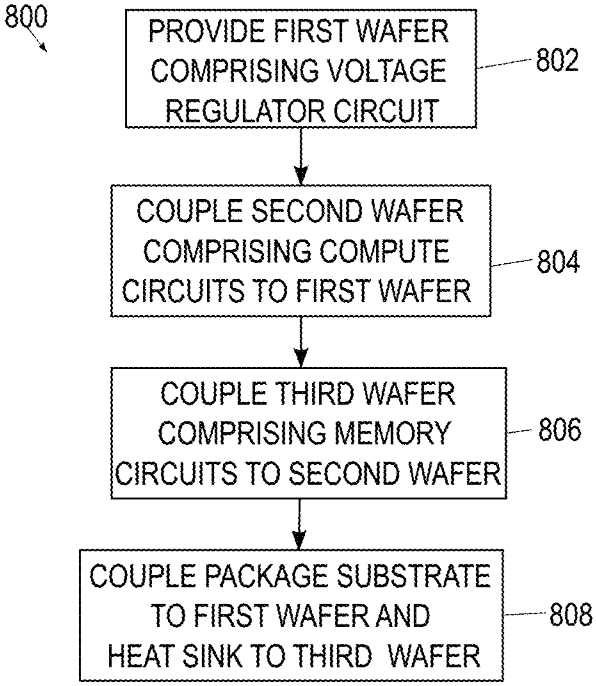
FIG. 8 is a schematic flow diagram of example operations that may be associated with fabricating a microelectronic assembly according to some embodiments of the present disclosure.

FIG. 8 is a schematic flow diagram illustrating example operations 800 that may be associated with embodiments of methods to fabricate microelectronic assembly 100. At 802, a first wafer comprising voltage regulator circuits 124 is provided. In various embodiments, any wafer that is used in operations 800 may comprise a monolithic wafer, a reconstituted wafer, or a panel. In some embodiments, the panel may comprise either a structure analogous to a reconstituted wafer, that is, comprising a plurality of disaggregated IC dies surrounded by dielectric material, or another structure analogous to a monolithic wafer, that is, comprising an undivided monolithic substrate extending through the length and width of the panel. At 804, a second wafer comprising compute circuits 126 is coupled to the first wafer by interconnects 108. Coupling one wafer to another wafer includes hybrid bonding processes, for example, to form metal-metal bonds and dielectric-dielectric bonds having a pitch of less than 10 micrometers between adjacent metal-metal bonds. At 806, a third wafer comprising memory circuits 128 is coupled to the second wafer by interconnects 108. In various embodiments, operations 800 further comprise coupling additional wafers until a stack of wafers having a desired number of layers in the stack is obtained. At 808, package substrate 112 may be coupled to the bottom-most wafer and a heat sink may be coupled to the top-most wafer.

In some embodiments, the second wafer comprising compute circuits 126 may be a reconstituted wafer, comprising disaggregated IC dies 106 laterally surrounded by dielectric material 120; and at least one of the first wafer and the third wafer may be monolithic wafer 104. The structure from operations 802-806 may thus be similar to the embodiment of FIG. 1B. Other variations may be obtained by suitable changes to the order of operations and/or structures used in operations. For example, in embodiments where the first wafer and the second wafer are reconstituted wafers, and the third wafer is monolithic wafer 104, the structure obtained may be similar to the embodiment of FIG. 2. In another example, by provisioning memory circuit 128 in the second wafer and compute circuit 126 in the third wafer, the heat sink may be closer to compute circuit 126, enabling more efficient thermal management.

In some embodiments, the method may further comprise coupling a fourth wafer to the third wafer on a side of the third wafer opposite to the second wafer, the fourth wafer being another monolithic wafer 104. Such a process may enable the embodiment as shown in FIG. 3. In yet another example, the operations may further comprise forming interface layer 302 between any two of: the first wafer and the second wafer or the second wafer and the third wafer. In some embodiments, the structure may be diced through the first wafer, the second wafer, and the third wafer, for example, in applications that do not use an entire wafer, but rather only a portion thereof.

Although FIG. 8 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 8 may be modified in accordance with the present disclosure to fabricate others of microelectronic assembly 100 disclosed herein. Although various operations are illustrated in FIG. 8 once each, the operations may be repeated as often as desired. For example, one or more operations may be performed in parallel to manufacture and test multiple microelectronic packages substantially simultaneously. In another example, the operations may be performed in a different order to reflect the structure of a particular microelectronic package in which one or more substrates or other components as described herein may be included.

Furthermore, the operations illustrated in FIG. 8 may be combined or may include more details than described. For example, the operations may be modified suitably without departing from the scope of the disclosure for IC dies 106 that do not have a semiconductor substrate, but rather, are fabricated on other materials, such as glass or ceramic materials. Still further, the various operations shown and described may further include other manufacturing operations related to fabrication of other components of the microelectronic assemblies described herein, or any devices that may include the microelectronic assemblies as described herein. For example, the operations not shown in FIG. 8 may include various cleaning operations, additional surface planarization operations, operations for surface roughening, operations to include barrier and/or adhesion layers as desired, and/or operations for incorporating microelectronic packages as described herein in, or with, an IC component, a computing device, or any desired structure or device.

Example Devices and Components

Figure 9:
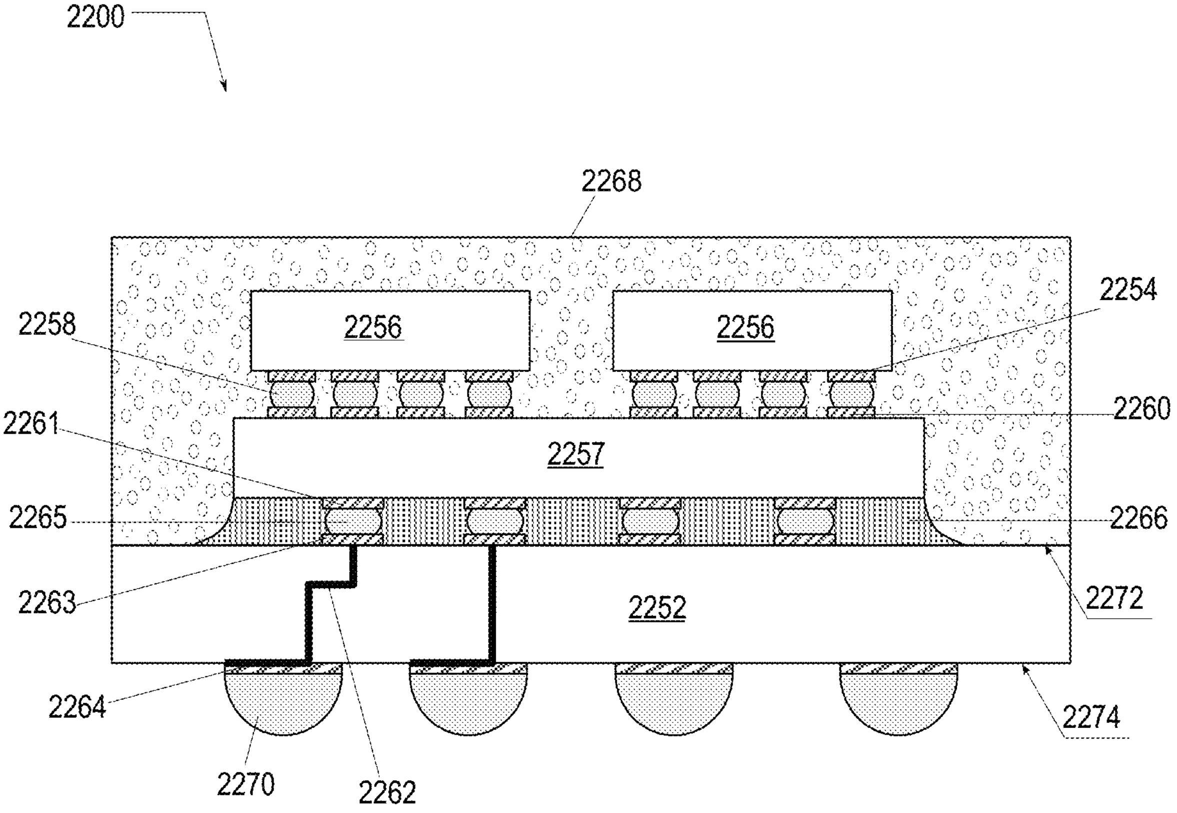
FIG. 9 is a cross-sectional view of a device package that includes one or more microelectronic assemblies in accordance with any of the embodiments disclosed herein.
Figure 11:
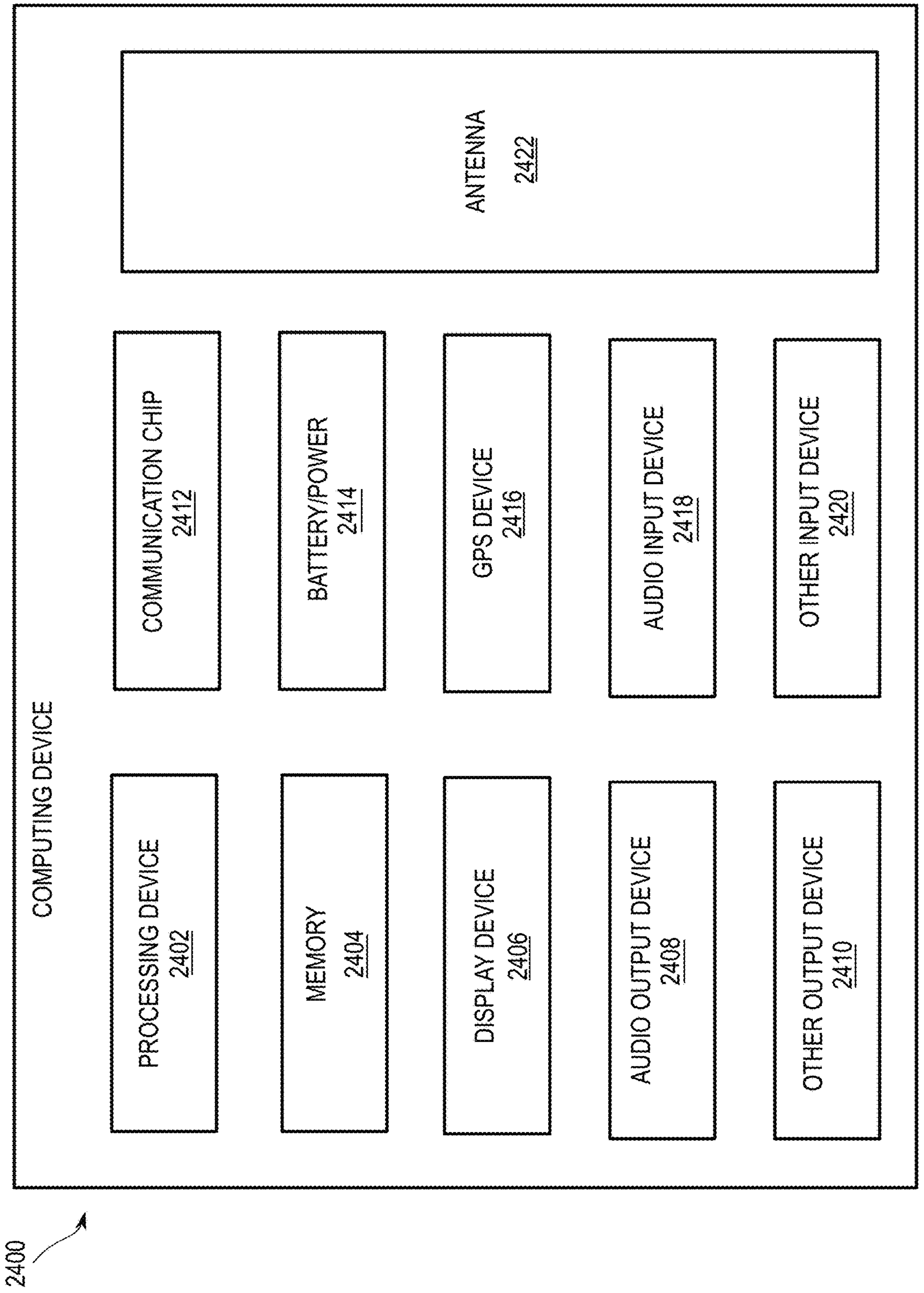
FIG. 11 is a block diagram of an example computing device that includes one or more microelectronic assemblies in accordance with any of the embodiments disclosed herein.

The packages disclosed herein, e.g., any of the embodiments shown in FIGS. 1-8 or any further embodiments described herein, may be included in any suitable electronic component. FIGS. 9-11 illustrate various examples of packages, assemblies, and devices that may be used with or include any of the IC packages as disclosed herein.

FIG. 9 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 10.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 10 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 9.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 9. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 11 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 9). In yet another example, any one or more of the components of computing device 2400 may include an IC device assembly 2300 (e.g., as shown in FIG. 10).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SoC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

Example 1 provides a microelectronic assembly (e.g., 100, FIG. 1A, 1B), comprising: a plurality of layers (e.g., 102) of monolithic wafers (e.g., 104) and disaggregated integrated circuit (IC) dies (e.g., 106), adjacent layers being coupled together by first interconnects (e.g., 108) having a pitch less than 10 micrometers between adjacent first interconnects, the disaggregated IC dies arranged with portions of the monolithic wafers into modular sub-assemblies (e.g., 110); and a package substrate (e.g., 112) coupled to the modular sub-assemblies by second interconnects (e.g., 114) having a pitch greater than 10 micrometers between adjacent second interconnects, in which: each layer comprises either the monolithic wafer or the disaggregated IC dies, the disaggregated IC dies are surrounded laterally by a dielectric material (e.g., 120), and the disaggregated IC dies are arranged with portions of the monolithic wafers such that a voltage regulator circuit (e.g., 124) in a first layer of the plurality of layers, a compute circuit (e.g., 126) in a second layer of the plurality of layers, and a memory circuit (e.g., 128) in a third layer of the plurality of layers are conductively coupled together at least in an intra-modular power delivery circuitry (e.g., 129).

Example 2 provides the microelectronic assembly of example 1, in which the monolithic wafer has an approximately circular shape having a diameter approximately between 200 millimeters and 300 millimeters.

Example 3 provides the microelectronic assembly of example 1, in which the monolithic wafer has a rectangular shape of approximately between 400 millimeters and 600 millimeters along any one side.

Example 4 provides the microelectronic assembly of any one of examples 1-3, in which the modular sub-assembly further comprises through-dielectric vias (TDVs) (e.g., 122) in the dielectric material around the disaggregated IC dies.

Example 5 provides the microelectronic assembly of example 4, in which a conductive pathway (e.g., 138A) between the memory circuit and the voltage regulator circuit is through at least one of the TDVs.

Example 6 provides the microelectronic assembly of example 5, in which a conductive pathway (e.g., 138C) between the memory circuit and the voltage regulator circuit is further through the package substrate.

Example 7 provides the microelectronic assembly of any one of examples 1-6, in which the IC dies comprise: respective substrates (e.g., 130); and respective metallization stacks (e.g., 132) including a plurality of layers of the dielectric material, conductive traces (e.g., 134) between the layers of the dielectric material, and conductive vias through the layers of the dielectric material.

Example 8 provides the microelectronic assembly of example 7, in which conductive traces in a first subset are smaller than conductive traces in a second subset in the respective metallization stacks.

Example 9 provides the microelectronic assembly of example 8, in which: the conductive traces in the first subset are configured for carrying signals, and the conductive traces in the second subset are configured for power distribution.

Example 10 provides the microelectronic assembly of any one of examples 7-9, in which one of the IC dies comprises through-substrate vias (TSVs) (e.g., 136) in the substrate.

Example 11 provides the microelectronic assembly of example 10, in which a conductive pathway (e.g., 138A) between the memory circuit and the voltage regulator circuit is through at least one of the TSVs.

Example 12 provides the microelectronic assembly of any one of examples 1-11, in which a conductive pathway (e.g., 138B) between laterally adjacent modular sub-assemblies comprises conductive traces in one layer (e.g., 102(3)) farthest from the package substrate.

Example 13 provides the microelectronic assembly of any one of examples 1-11, in which (e.g., FIG. 3): a conductive pathway (e.g., 138D) between laterally adjacent modular sub-assemblies is through conductive traces (e.g., 308) in an interface layer (e.g., 302) between two adjacent layers (e.g., 102(2), 102(3)).

Example 14 provides the microelectronic assembly of any one of examples 1-13, in which (e.g., FIG. 3): a fourth layer (e.g., 102(4)) in the plurality of layers is farthest from the package substrate, the fourth layer comprises one of the monolithic wafers (e.g., 104B), the monolithic wafer comprises conductive pathways (e.g., 138E) that are not part of any intra-modular power delivery circuitry, and the conductive pathways conductively couple at least two modular sub-assemblies.

Example 15 provides the microelectronic assembly of any one of examples 1-14, further comprising (e.g., FIG. 4) interconnect IC dies (e.g., 402) that are not part of any intra-modular power delivery circuitry, in which: one of the interconnect IC dies (e.g., 104B) extends across a shared edge of two adjacent modular sub-assemblies, and a conductive pathway (e.g., 138F) between the at least two modular sub-assemblies is through the interconnect IC die.

Example 16 provides the microelectronic assembly of example 15, in which (e.g., FIG. 4) the disaggregated IC dies of the modular sub-assemblies and the interconnect IC dies are in a common layer in the plurality of layers.

Example 17 provides the microelectronic assembly of example 16, in which a portion of the conductive pathway (e.g., 138F) is through one of the monolithic wafers (e.g., 104) in another layer (e.g., 102(3)) adjacent to the common layer.

Example 18 provides the microelectronic assembly example 15, in which (e.g., FIG. 5) any two adjacent modular sub-assemblies are conductively coupled through a single interconnect IC die.

Example 19 provides the microelectronic assembly of example 15, in which (e.g., FIGS. 6A-6B) any three adjacent modular sub-assemblies are conductively coupled through a single interconnect IC die.

Example 20 provides the microelectronic assembly of example 15, in which (e.g., FIG. 7A) any four adjacent modular sub-assemblies are conductively coupled through a single interconnect IC die.

Example 21 provides the microelectronic assembly of any one of examples 1-20, in which among the several layers, the third layer comprising the memory circuit is farthest from the package substrate.

Example 22 provides the microelectronic assembly of any one of examples 1-20, in which among the several layers, the second layer comprising the compute circuit is farthest from the package substrate.

Example 23 provides the microelectronic assembly of any one of examples 1-22, in which among the several layers, the first layer comprising the voltage regulator circuit is closest to the package substrate.

Example 24 provides the microelectronic assembly of any one of examples 1-23, in which: the voltage regulator circuit comprises: a first voltage rail configured to provide current at a first voltage; and a second voltage rail configured to provide current at a second voltage, the memory circuit is conductively coupled to the first voltage rail, and the compute circuit is conductively coupled to the second voltage rail.

Example 25 provides the microelectronic assembly of example 24, in which the memory circuit and the compute circuit are conductively coupled to the first voltage rail and the second voltage rail, respectively, through separate TDVs in the dielectric material.

Example 26 provides the microelectronic assembly of any one of examples 24-25, in which: the second layer is between the first layer and the third layer, the second layer comprises the disaggregated IC dies, the first layer and the third layer comprise the monolithic wafers, the disaggregated IC dies are coupled front-to-front with the monolithic wafer in the third layer, and the disaggregated IC dies are coupled back-to-back with the monolithic wafer in the first layer.

Example 27 provides a microelectronic structure, comprising (e.g., FIG. 1B): a disaggregated IC die having a first side and an opposing second side; a portion of a first monolithic wafer coupled to the first side of the disaggregated IC die by interconnects having a pitch of less than 10 micrometers between adjacent interconnects; and a portion of a second monolithic wafer coupled to the second side of the disaggregated IC die by interconnects having another pitch of less than 10 micrometers between adjacent interconnects, in which: the disaggregated IC die is surrounded by an inorganic dielectric material, the disaggregated IC die comprises a compute circuit, the portion of the first monolithic wafer comprises a voltage regulator circuit, the portion of the second monolithic wafer comprises a memory circuit, and the microelectronic structure is part of a larger microelectronic device comprising the first monolithic wafer and the second monolithic wafer.

Example 28 provides the microelectronic structure of example 27, in which a power delivery circuitry in the microelectronic structure comprises the voltage regulator circuit, the compute circuit, and the memory circuit.

Example 29 provides the microelectronic structure of any one of examples 27-28, in which: the disaggregated IC die is coupled back-to-back with the portion of the first monolithic wafer, and the disaggregated IC die is coupled front-to-front with the portion of the second monolithic wafer.

Example 30 provides the microelectronic structure of any one of examples 27-29, in which TDVs are present in the inorganic dielectric material around the disaggregated IC die.

Example 31 provides the microelectronic structure of example 30, in which the first monolithic wafer comprises TSVs.

Example 32 provides the microelectronic structure of example 31, in which the memory circuit in the portion of the second monolithic wafer is conductively coupled to the voltage regulator circuit in the portion of the first monolithic wafer through at least one of the TDVs in the dielectric material around the disaggregated IC die, and at least one of the TSVs in the first monolithic wafer.

Example 33 provides the microelectronic structure of any one of examples 31-32, further comprising a package substrate, in which the first monolithic wafer is coupled to the package substrate.

Example 34 provides the microelectronic structure of example 33, in which a conductive pathway through the second monolithic wafer conductively couples the microelectronic structure with another laterally adjacent microelectronic structure.

Example 35 provides the microelectronic structure of example 34, in which: the conductive pathway is through an interconnect IC die, a portion of the interconnect IC die is in the microelectronic structure, and another portion of the interconnect IC die is in the other laterally adjacent microelectronic structure.

Example 36 provides the microelectronic structure of any one of examples 27-35, in which: the voltage regulator circuit comprises: a first voltage rail configured to provide current at a first voltage; and a second voltage rail configured to provide current at a second voltage, the memory circuit is conductively coupled to the first voltage rail, and the compute circuit is conductively coupled to the second voltage rail.

Example 37 provides a microelectronic structure, comprising (e.g., FIG. 2, 4): a first disaggregated IC die having a first side and an opposing second side; a second disaggregated IC die coupled to the first side of the first disaggregated IC die by interconnects having another pitch of less than 10 micrometers between adjacent interconnects; and a portion of a monolithic wafer coupled to the second side of the first disaggregated IC die by interconnects having a pitch of less than 10 micrometers between adjacent interconnects, in which: the first disaggregated IC die is surrounded by an inorganic dielectric material, the first disaggregated IC die comprises a compute circuit, the second disaggregated IC die comprises a voltage regulator circuit, the portion of the monolithic wafer comprises a memory circuit, and the microelectronic structure is part of a larger microelectronic device comprising the monolithic wafer.

Example 38 provides the microelectronic structure of example 37, in which a power delivery circuitry in the microelectronic structure comprises the voltage regulator circuit, the compute circuit, and the memory circuit.

Example 39 provides the microelectronic structure of any one of examples 37-38, in which: the first disaggregated IC die is coupled back-to-back with the second disaggregated IC die, and the first disaggregated IC die is coupled front-to-front with the portion of the monolithic wafer.

Example 40 provides the microelectronic structure of any one of examples 37-39, in which TDVs are present in the inorganic dielectric material around the first disaggregated IC die and the second disaggregated IC die.

Example 41 provides the microelectronic structure of example 40, further comprising a package substrate, in which the second disaggregated IC die is coupled to the package substrate.

Example 42 provides the microelectronic structure of example 41, in which the memory circuit in the portion of the monolithic wafer is conductively coupled to the voltage regulator circuit in the second disaggregated IC die through the package substrate and the TDVs in the dielectric material around the first disaggregated IC die and the second disaggregated IC die.

Example 43 provides the microelectronic structure of example 42, in which a conductive pathway through the monolithic wafer conductively couples the microelectronic structure with another laterally adjacent microelectronic structure.

Example 44 provides the microelectronic structure of example 43, in which (e.g., FIG. 4): the conductive pathway is further through an interconnect IC die, a portion of the interconnect IC die is in the microelectronic structure, and another portion of the interconnect IC die is in the other laterally adjacent microelectronic structure.

Example 45 provides the microelectronic structure of any one of examples 37-44, in which: the voltage regulator circuit comprises: a first voltage rail configured to provide current at a first voltage; and a second voltage rail configured to provide current at a second voltage, the memory circuit is conductively coupled to the first voltage rail, and the compute circuit is conductively coupled to the second voltage rail.

Example 46 provides a microelectronic structure, comprising (e.g., FIG. 3): a first disaggregated IC die having a first side and an opposing second side; a portion of a first monolithic wafer coupled to the first side of the first disaggregated IC die by interconnects having another pitch of less than 10 micrometers between adjacent interconnects; a second disaggregated IC die coupled to the second side of the first disaggregated IC die by interconnects having a pitch of less than 10 micrometers between adjacent interconnects; and a portion of a second monolithic wafer coupled to the second disaggregated IC die opposite to the first disaggregated IC die, in which: the first disaggregated IC die and the second disaggregated IC die are surrounded by an inorganic dielectric material, the first disaggregated IC die comprises a compute circuit, the second disaggregated IC die comprises a memory circuit, the portion of the first monolithic wafer comprises a voltage regulator circuit, the portion of the second monolithic wafer comprises an interconnect circuit, and the microelectronic structure is part of a larger microelectronic device comprising the first monolithic wafer and the second monolithic wafer.

Example 47 provides the microelectronic structure of example 46, in which a power delivery circuitry in the microelectronic structure comprises the voltage regulator circuit, the compute circuit and the memory circuit.

Example 48 provides the microelectronic structure of any one of examples 46-47, in which: the first disaggregated IC die is coupled back-to-back with the portion of the first monolithic wafer, the first disaggregated IC die is coupled front-to-front with the second disaggregated IC die, and the second disaggregated IC die is coupled back-to-front with the portion of the second monolithic wafer.

Example 49 provides the microelectronic structure of any one of examples 46-48, in which TDVs are present in the inorganic dielectric material around the first disaggregated IC die and the second disaggregated IC die.

Example 50 provides the microelectronic structure of example 49, further comprising a package substrate, in which the first monolithic wafer is coupled to the package substrate.

Example 51 provides the microelectronic structure of any one of examples 46-50, further comprising an interface layer between the first disaggregated IC die and the second disaggregated IC die, in which a conductive pathway through the interface layer conductively couples the microelectronic structure with another laterally adjacent microelectronic structure.

Example 52 provides the microelectronic structure of any one of examples 46-50, in which a conductive pathway through the second monolithic wafer conductively couples the microelectronic structure with another laterally adjacent microelectronic structure.

Example 53 provides the microelectronic structure of any one of examples 46-52, in which: the voltage regulator circuit comprises: a first voltage rail configured to provide current at a first voltage; and a second voltage rail configured to provide current at a second voltage, the memory circuit is conductively coupled to the first voltage rail, and the compute circuit is conductively coupled to the second voltage rail.

Example 54 provides a method for fabricating a microelectronic assembly, the method comprising (e.g., FIG. 8): providing a first wafer comprising IC dies; coupling a second wafer to the first wafer by forming metal-metal bonds and dielectric-dielectric bonds having a pitch of less than 10 micrometers between adjacent metal-metal bonds, the first wafer comprising IC dies; and coupling a third wafer to the second wafer on a side of the second wafer opposite to the first wafer, the coupling comprising forming metal-metal bonds and dielectric-dielectric bonds having a pitch of less than 10 micrometers between adjacent metal-metal bonds, the third wafer comprising IC dies, in which: at least one of the first wafer, the second wafer, or the third wafer is a reconstituted wafer having disaggregated IC dies surrounded by a dielectric material, at least another of the first wafer, the second wafer, or the third wafer is a monolithic wafer, and the first wafer comprises voltage regulator circuits, the second wafer comprises at least one of compute circuits and memory circuits, and the third wafer comprises at least the other of compute circuits and memory circuits.

Example 55 provides the method of example 54, further comprising dicing through the first wafer, the second wafer, and the third wafer, in which dicing through the reconstituted wafer comprises cutting through the dielectric material.

Example 56 provides the method of any one of examples 54-55, in which: the third wafer comprises the disaggregated IC dies, and the method further comprises coupling a fourth wafer to the third wafer on a side of the third wafer opposite to the second wafer, the fourth wafer being a monolithic wafer.

Example 57 provides the method of any one of examples 54-56, further comprising forming an interface layer between any two of: the first wafer and the second wafer or the second wafer and the third wafer, in which the interface layer comprises conductive traces in the dielectric material.

Example 58 provides the method of any one of examples 54-57, further comprising coupling a package substrate to the first wafer and a heat sink to the third wafer.

Example 59 provides the method of any one of examples 54-58, further comprising coupling additional wafers until a stack of wafers having a desired number of layers in the stack is obtained.

Example 60 provides a method for fabricating a microelectronic assembly, the method comprising (e.g., FIG. 8): providing a first panel comprising IC dies; coupling a second panel to the first panel by forming metal-metal bonds and dielectric-dielectric bonds having a pitch of less than 10 micrometers between adjacent metal-metal bonds, the second panel comprising IC dies; and coupling a third panel to the second panel on a side of the second panel opposite to the first panel, the coupling comprising forming metal-metal bonds and dielectric-dielectric bonds having a pitch of less than 10 micrometers between adjacent metal-metal bonds, the third panel comprising IC dies, in which: at least one of the first panel, the second panel, or the third panel comprises disaggregated IC dies surrounded by a dielectric material, at least another of the first panel, the second panel, or the third panel comprises an undivided monolithic substrate extending throughout a length and width thereof, and the first panel comprises voltage regulator circuits, the second panel comprises at least one of compute circuits and memory circuits, and the third panel comprises at least the other of compute circuits and memory circuits.

Example 61 provides the method of example 60, further comprising dicing through the first panel, the second panel, and the third panel, in which dicing through the reconstituted panel comprises cutting through the dielectric material.

Example 62 provides the method of any one of examples 60-61, in which: the third panel comprises the disaggregated IC dies, and the method further comprises coupling a fourth panel to the third panel on a side of the third panel opposite to the second panel, the fourth panel comprising an undivided monolithic substrate.

Example 63 provides the method of any one of examples 60-62, further comprising forming an interface layer between any two of: the first panel and the second panel or the second panel and the third panel, in which the interface layer comprises conductive traces in the dielectric material.

Example 64 provides the method of any one of examples 60-63, further comprising coupling a package substrate to the first panel and a heat sink to the third panel.

Example 65 provides the method of any one of examples 60-64, further comprising coupling additional panels until a stack of panels having a desired number of layers in the stack is obtained.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:

a plurality of layers comprising at least one layer comprising a monolithic wafer and another layer comprising disaggregated integrated circuit (IC) dies, wherein adjacent layers of the plurality of layers are coupled together by first interconnects having a first pitch, and wherein the disaggregated IC dies are arranged with portions of the monolithic wafer into modular sub-assemblies; and a package substrate coupled to the modular sub-assemblies by second interconnects having a second pitch that is greater than the first pitch, wherein:

the disaggregated IC dies are surrounded laterally by a dielectric material, a conductive pathway between laterally adjacent modular sub-assemblies comprises a conductive trace in a layer farthest from the package substrate, and a voltage regulator circuit in a first layer of the plurality of layers, a compute circuit in a second layer of the plurality of layers, and a memory circuit in a third layer of the plurality of layers are conductively coupled together at least in intra-modular power delivery circuitry.

2. The microelectronic assembly of claim 1, wherein the conductive pathway is a first conductive pathway, the conductive trace is a first conductive trace, and wherein: a second conductive pathway between the laterally adjacent modular sub-assemblies is through a second conductive traces in an interface layer between two adjacent layers.

3. The microelectronic assembly of claim 1, wherein the monolithic wafer is a first monolithic wafer, and wherein:

a fourth layer in the plurality of layers is the layer farthest from the package substrate, the fourth layer comprises a second monolithic wafer, at least one of the first monolithic wafer and the second monolithic wafer comprises conductive pathways that are not part of the intra-modular power delivery circuitry, and at least two of the modular sub-assemblies are conductively coupled by the conductive pathways.

4. The microelectronic assembly of claim 1, wherein the conductive pathway is a first conductive pathway, and wherein the microelectronic assembly further comprises:

an interconnect IC die that is not part of the intra-modular power delivery circuitry, wherein:

the interconnect IC die extends across a shared edge of two laterally adjacent modular sub-assemblies, and a second conductive pathway between the two laterally adjacent modular sub-assemblies is through the interconnect IC die.

5. The microelectronic assembly of claim 4, wherein:

the two laterally adjacent modular sub-assemblies are conductively coupled through the interconnect IC die.

6. The microelectronic assembly of claim 4, wherein:
three of the laterally adjacent modular sub-assemblies are conductively coupled through the interconnect IC die.

7. The microelectronic assembly of claim 4, wherein:
four of the laterally adjacent modular sub-assemblies are conductively coupled through the interconnect IC die.

8. A microelectronic structure, comprising:
a disaggregated IC die having a first side and an opposing second side;
a first portion of a first monolithic wafer coupled to the first side of the disaggregated IC die; and
a second portion of a second monolithic wafer coupled to the second side of the disaggregated IC die,
wherein:
the disaggregated IC die is surrounded by an inorganic dielectric material,
through-dielectric vias (TDVs) are present in the inorganic dielectric material around the disaggregated IC die,
the first monolithic wafer comprises through-substrate vias (TSVs),
the disaggregated IC die comprises a compute circuit,
the first portion of the first monolithic wafer comprises a voltage regulator circuit,
the second portion of the second monolithic wafer comprises a memory circuit,
the microelectronic structure is part of a larger microelectronic device comprising the first monolithic wafer and the second monolithic wafer, and
the memory circuit is conductively coupled to the voltage regulator circuit through at least one of the TDVs and at least one of the TSVs.

9. The microelectronic structure of claim 8, wherein power delivery circuitry in the microelectronic structure comprises the voltage regulator circuit, the compute circuit and the memory circuit.

10. The microelectronic structure of claim 8, wherein:
the disaggregated IC die is coupled back-to-back with the first portion of the first monolithic wafer, and
the disaggregated IC die is coupled front-to-front with the second portion of the second monolithic wafer.

11. The microelectronic structure of claim 8, further comprising:
a package substrate, wherein:
the first monolithic wafer is coupled to the package substrate, and
the microelectronic structure is conductively coupled with an additional laterally adjacent microelectronic structure through a conductive pathway through the second monolithic wafer.

12. The microelectronic structure of claim 11, wherein:
the conductive pathway is through an interconnect IC die,
a third portion of the interconnect IC die is in the microelectronic structure, and
a fourth portion of the interconnect IC die is in the additional laterally adjacent microelectronic structure.

13. The microelectronic structure of claim 8, wherein:
the voltage regulator circuit comprises:
a first voltage rail configured to provide current at a first voltage, and
a second voltage rail configured to provide current at a second voltage,
the memory circuit is conductively coupled to the first voltage rail, and
the compute circuit is conductively coupled to the second voltage rail.

14. A method for fabricating a microelectronic assembly, the method comprising:
providing a first wafer comprising first IC dies;
coupling a second wafer to the first wafer by forming first metal-metal bonds and first dielectric-dielectric bonds having a first pitch of less than 10 micrometers; and
coupling a third wafer to the second wafer on a side of the second wafer opposite to the first wafer, the coupling of the third wafer to the second wafer comprising forming second metal-metal bonds and second dielectric-dielectric bonds having a second pitch of less than 10 micrometers, the third wafer comprising second IC dies,
wherein:
at least one of the first wafer, the second wafer or the third wafer is a reconstituted wafer having disaggregated IC dies surrounded by a dielectric material,
at least another of the first wafer, the second wafer or the third wafer is a monolithic wafer, and
the first wafer comprises voltage regulator circuits, one of the second wafer and the third wafer comprises compute circuits, and another of the second wafer and the third wafer comprises memory circuits.

15. The method of claim 14, wherein the side is a first side, and wherein:
the third wafer comprises the disaggregated IC dies, and
the method further comprises coupling a fourth wafer to the third wafer on a second side of the third wafer opposite to the second wafer, the fourth wafer being the monolithic wafer.

16. The method of claim 14, further comprising forming an interface layer between any two of: the first wafer and the second wafer or the second wafer and the third wafer, wherein the interface layer comprises conductive traces in the dielectric material.

17. The method of claim 14, further comprising coupling a package substrate to the first wafer and a heat sink to the third wafer.

18. The method of claim 14, further comprising coupling additional wafers until a stack of wafers having a desired number of layers in the stack is obtained.

19. The microelectronic assembly of claim 1, wherein:
the dielectric material surrounding the disaggregated IC dies is an inorganic dielectric material, through-dielectric vias (TDVs) are present in the inorganic dielectric material around the disaggregated IC dies,
the monolithic wafer comprises through-substrate vias (TSVs), and
the memory circuit is conductively coupled to the voltage regulator circuit through at least one of the TDVs and at least one of the TSVs.

20. The microelectronic structure of claim 8, further comprising:
a package substrate, wherein:
the microelectronic structure is one of a plurality of modular sub-assemblies of a microelectronic assembly,
the plurality of modular sub-assemblies is coupled to the package substrate, and
a conductive pathway between the microelectronic structure and an additional laterally adjacent microelectronic structure of the plurality of modular sub-assemblies comprises a conductive trace in a layer farthest from the package substrate.

* * * * *